United States Patent
Al-Shamma et al.

(10) Patent No.: US 9,536,617 B2
(45) Date of Patent: Jan. 3, 2017

(54) AD HOC DIGITAL MULTI-DIE POLLING FOR PEAK ICC MANAGEMENT

(71) Applicant: SANDISK TECHNOLOGIES INC., Plano, TX (US)

(72) Inventors: Ali Al-Shamma, San Jose, CA (US); Farookh Moogat, Fremont, CA (US); Chang Siau, Saratoga, CA (US); Grishma Shah, San Jose, CA (US); Kenneth Louie, Milpitas, CA (US); Khanh Nguyen, Milpitas, CA (US); Kapil Verma, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/928,992

(22) Filed: Oct. 30, 2015

(65) Prior Publication Data

US 2016/0293264 A1     Oct. 6, 2016

Related U.S. Application Data

(60) Provisional application No. 62/142,615, filed on Apr. 3, 2015.

(51) Int. Cl.
| | | |
|---|---|---|
| G11C 16/06 | (2006.01) | |
| G11C 16/30 | (2006.01) | |
| G11C 16/24 | (2006.01) | |

(52) U.S. Cl.
CPC ............ G11C 16/30 (2013.01); G11C 16/24 (2013.01)

(58) Field of Classification Search
CPC ................................. G11C 16/30; G11C 16/24
USPC .................... 365/185.25, 226, 227, 228
See application file for complete search history.

(56) References Cited

U.S. PATENT DOCUMENTS

| | | | | |
|---|---|---|---|---|
| 6,259,267 B1 * | 7/2001 | Fujiwara | ............ | G01R 31/2879 324/750.05 |
| 7,447,602 B1 * | 11/2008 | Bradley | ........... | G01R 31/31718 702/60 |
| 7,667,485 B2 * | 2/2010 | Sakata | ................ | G11C 5/147 326/21 |
| 8,281,160 B1 * | 10/2012 | Bai | .................... | G06F 1/3228 713/300 |
| 8,560,764 B2 | 10/2013 | Huffman | | |
| 8,769,318 B2 * | 7/2014 | Seroff | ........................ | 713/300 |
| 2007/0108608 A1 * | 5/2007 | Han | ................ | G01R 31/31851 257/734 |
| 2008/0048715 A1 * | 2/2008 | Balasubramanian | .. | G01K 7/015 326/37 |

(Continued)

*Primary Examiner* — Viet Q Nguyen
(74) *Attorney, Agent, or Firm* — Vierra Magen Marcus LLP

(57) ABSTRACT

Systems and methods for reducing peak power supply current in a non-volatile memory system that includes a plurality of memory die are described. In some cases, prior to a first memory die of the plurality of memory die performing a particular memory operation (e.g., a programming operation), the first memory die may poll other memory die of the plurality of memory die to determine a total peak power supply current for the plurality of memory die. In response to detecting that the total peak power supply current for the plurality of memory die is at or above a peak current threshold (e.g., more than 200 mA), the first memory die may delay the performance of the particular memory operation or slow down the performance of the particular memory operation.

20 Claims, 10 Drawing Sheets

(56) References Cited

U.S. PATENT DOCUMENTS

| | | | |
|---|---|---|---|
| 2009/0128186 A1* | 5/2009 | Balasubramanian | G01K 7/015 326/38 |
| 2010/0156522 A1* | 6/2010 | Mizuno | G06F 1/32 327/544 |
| 2010/0194434 A1* | 8/2010 | Tran Vo | H03K 5/135 326/93 |
| 2011/0173462 A1* | 7/2011 | Wakrat | G06F 1/26 713/300 |
| 2011/0255317 A1* | 10/2011 | Zhubing | H05B 33/0815 363/125 |
| 2012/0140579 A1* | 6/2012 | Kim | G11C 5/143 365/189.07 |
| 2012/0290864 A1* | 11/2012 | Seroff | G06F 1/3206 713/340 |
| 2013/0038972 A1* | 2/2013 | Yang | H02J 7/0031 361/90 |
| 2013/0318285 A1 | 11/2013 | Pignatelli | |
| 2013/0339762 A1* | 12/2013 | Bose | H01L 23/00 713/300 |
| 2014/0029357 A1* | 1/2014 | Lee | G11C 16/30 365/189.11 |
| 2015/0121052 A1* | 4/2015 | Emma | G06F 9/44 713/1 |
| 2015/0363342 A1* | 12/2015 | Tuers | G06F 13/4243 710/117 |

\* cited by examiner

AD HOC DIGITAL MULTI-DIE POLLING FOR PEAK ICC MANAGEMENT

CLAIM OF PRIORITY

The present application claims priority to U.S. Provisional Application No. 62/142,615, entitled "Ad Hoc Digital Multi-Die Polling for Peak ICC Management for Non-Volatile Storage Systems," filed Apr. 3, 2015, which is herein incorporated by reference in its entirety.

BACKGROUND

Semiconductor memory is widely used in various electronic devices such as mobile phones, digital cameras, personal digital assistants, SSDs, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

It is common for semiconductor memory die to be placed into a package to allow for easier handling and assembly, and to protect the die from damage. Although a plural form of "die" is "dice," it is common industry practice to use "die" as a plural form as well as the singular form. In one example, semiconductor memory die and/or other integrated circuits, such as processors, may be encased within a package wherein the die may be stacked on top of one another within the package. The package may comprise a surface-mount package (e.g., a BGA package or TSOP package). One benefit of vertically stacking die within a package (e.g., stacking 16 die within a single package) is that form factor and/or package size may be reduced. In some cases, the package may comprise a stacked multi-chip package, a system-in-package (SiP), or a chip stack multichip module (MCM). Vertical connections between the stacked die including direct vertical connections through a die's substrate (e.g., through a silicon substrate) may be formed within each die before or after die-to-die bonding.

DETAILED DESCRIPTION

Figure 1A:
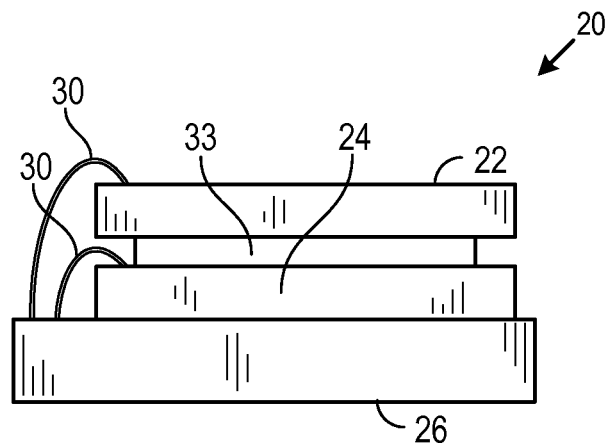
FIGS. 1A-1C depict various embodiments of a plurality of stacked die within a semiconductor package.

Technology is described for reducing peak power supply current (e.g., peak ICC) in a non-volatile memory system that includes a plurality of memory die. The non-volatile memory system may include a plurality of memory die and a system controller for controlling operations performed by each memory die of the plurality of memory die (e.g., read operations, write operations, or erase operations). The plurality of memory die may comprise multiple die within a package. In some cases, prior to a first memory die of the plurality of memory die performing a particular memory operation (e.g., performing a programming operation or an erase operation), the first memory die may poll other memory die of the plurality of memory die (e.g., all of the other memory die within the plurality of memory die) to determine a total peak power supply current for the plurality of memory die. Each of the other memory die may transmit a code (e.g., a 3-bit code or an 8-bit code) associated with the amount of peak power supply current being consumed by the memory die when the memory die is polled. In one embodiment, each of the other memory die may transmit a first code associated with the amount of power supply current being consumed when the memory die is polled and/or a second code associated with a power supply current associated with a particular time period during which the memory die is polled. In response to detecting that the total peak power supply current for the plurality of memory die is at or above a peak current threshold (e.g., more than 200 mA), the first memory die may delay the performance of the particular memory operation (e.g., delay performing the particular memory operation for 10 μs) or slow down the performance of the particular memory operation (e.g., to allow for a slower ramp rate for internally generated voltages such as a programming voltage).

In some embodiments, if the first memory die determines that the total peak power supply current for the plurality of memory die is at or above a peak current threshold, then the first memory die may delay the particular memory operation for a first delay time period (e.g., for 5 μs), delay the particular memory operation until a subsequent polling of the plurality of memory die provides a total peak power supply current for the plurality of memory die that is below the peak current threshold (e.g., the first memory die may continuously poll the other memory die every 2-3 μs until the total peak power supply current for the plurality of memory die is below the peak current threshold), or perform the particular memory operation using a reduced ramp rate for charging up internal power supplies (e.g., running the charge pumps at a reduced clock frequency when generating internal power supply voltages). A reduced clock frequency may be generated using a clock divider (e.g., to reduce the clock frequency by a factor or 2 or 4). One reason for slowing down the ramp rate of charging up an internal power supply from a first voltage to a second voltage greater than the first voltage (e.g., from 0V to 20V) is that peak power supply current may be reduced.

In one embodiment, the first memory die may set a bit line precharge speed (e.g., the rate at which bit lines are precharged to a particular voltage) based on the total peak power supply current for the plurality of memory die. In one example, if the difference between the total peak power supply current for the plurality of memory die and a maximum current threshold is greater than a delta threshold, then a first bit line precharge time may be used; however, if the difference between the total peak power supply current for the plurality of memory die and the maximum current threshold is less than the delta threshold, then a second bit line precharge time less than the first bit line precharge time may be used. In another embodiment, the first memory die may set a charge pump ramp rate based on the total peak power supply current for the plurality of memory die.

In some cases, during a memory operation, a maximum power supply current may occur when charging up internal voltages using a voltage multiplier (e.g., an on-chip charge pump circuit that generates a programming voltage), which may only occur during a small portion of the overall memory operation. In one example, a programming operation may take 200 μs to complete and the time to charge up internal voltages to support the programming operation may take 20 μs out of the 200 μs. In some cases, after a ramp rate for charging up an internal voltage has been reduced, if a subsequent polling of other memory die provides a total peak power supply current that is below the peak current threshold, then the reduced ramp rate may be increased in order to continue charging up the internal voltage at a faster rate.

In some cases, upon being polled for peak current information, a memory die may transmit a code associated with the amount of peak power supply current being consumed by the memory die. The code may be transmitted using pins that are not in use during polling (e.g., a VPP pin). In one example, the code may comprise a 3-bit code encoding eight different ranges of current values (e.g., from 0 mV to 700 mV in increments of 100 mV). The memory die may store a table in non-volatile memory that includes codes or numerical peak ICC values for sub-operations of a particular memory operation. In one example, a programming operation may be partitioned into a plurality of sub-operations and each of the sub-operations may correspond with a peak ICC value (e.g., the peak ICC value during generation of a programming voltage may be 200 μA and the peak ICC value during programming of a set of memory cells may be 40 μA). In another example, a programming operation may be partitioned into ten time periods and each time period of the ten time periods may correspond with a peak ICC value. A first time period of the ten time periods may correspond with a peak ICC value of 200 μA while a second time period of the ten time periods may correspond with a peak ICC value of 40 μA. In this case, for example, the first time period may correspond with charge pumps turning on to generate a programming voltage and/or charging up an internal node to the programming voltage.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 1B:
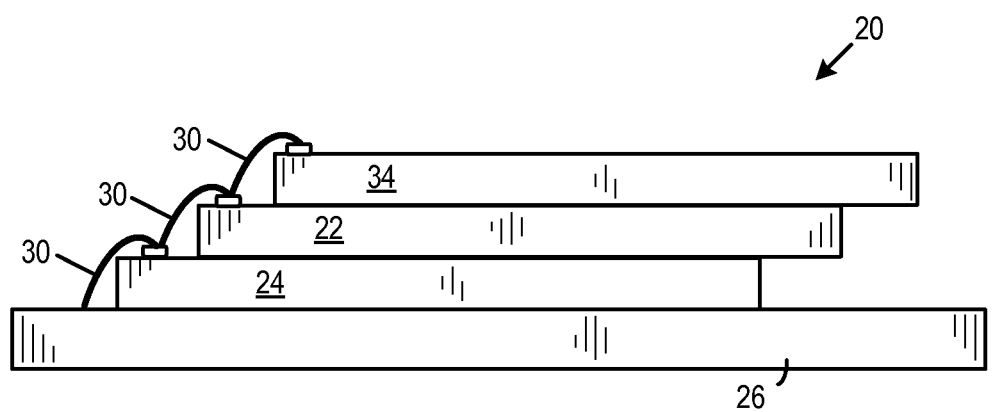
Figure 1C:
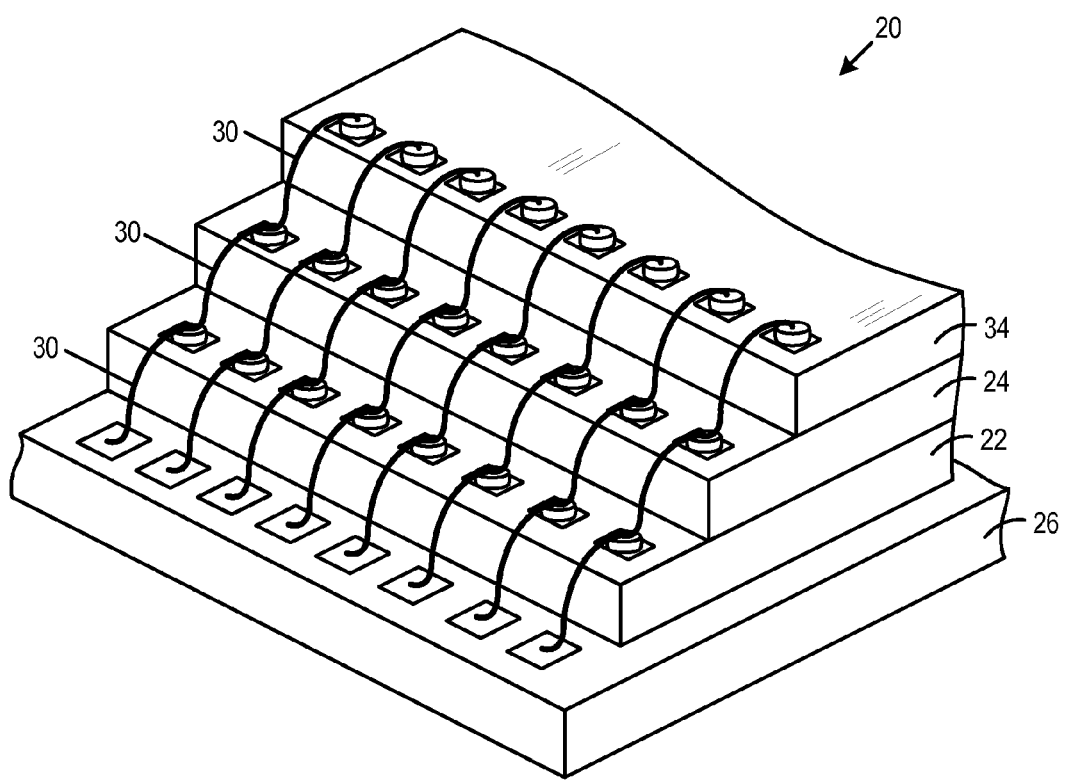

FIGS. 1A-1C depict various embodiments of a plurality of stacked die within a semiconductor package 20. As depicted, a plurality of semiconductor die, such as die 22, 24, and 34 may be mounted to a substrate 26 and encased within the semiconductor package 20. In one example, each of die 22, 24, and 34 may comprise a semiconductor memory die. In another example, die 22 may comprise a flash memory die and die 24 may comprise a memory controller. In some embodiments, the number of vertically stacked die within a package may comprise more than two die (e.g., 8 or 16 die within the package). Each of the semiconductor die may include bond pads on an upper surface of the die for allowing electrical access to integrated circuitry within the die. Each bond pad may correspond with an input pin, an output pin, or an input/output (I/O) pin that connects to the integrated circuitry. Wire bonding connections, such as bond wires 30, may be used to electrically connect a die with other die within the package or to substrate 26. The bond wires 30 may comprise a metal such as copper, aluminum, or gold.

As depicted in FIG. 1A, two or more semiconductor die may be stacked directly on top of each other, thereby taking up a small footprint on the substrate 26. However, in a vertically stacked configuration without through-silicon vias (TSVs), space must be provided between adjacent semiconductor die for the bond wire connections. A dielectric spacer layer 33 may be used to provide space for the bond wires 30 to be bonded to bond pads on the lower die 24. As depicted in FIGS. 1B-1C, instead of stacking die directly above each other, each of the stacked semiconductor die may be offset such that the bond pads on one side of each die are exposed.

Figure 2A:
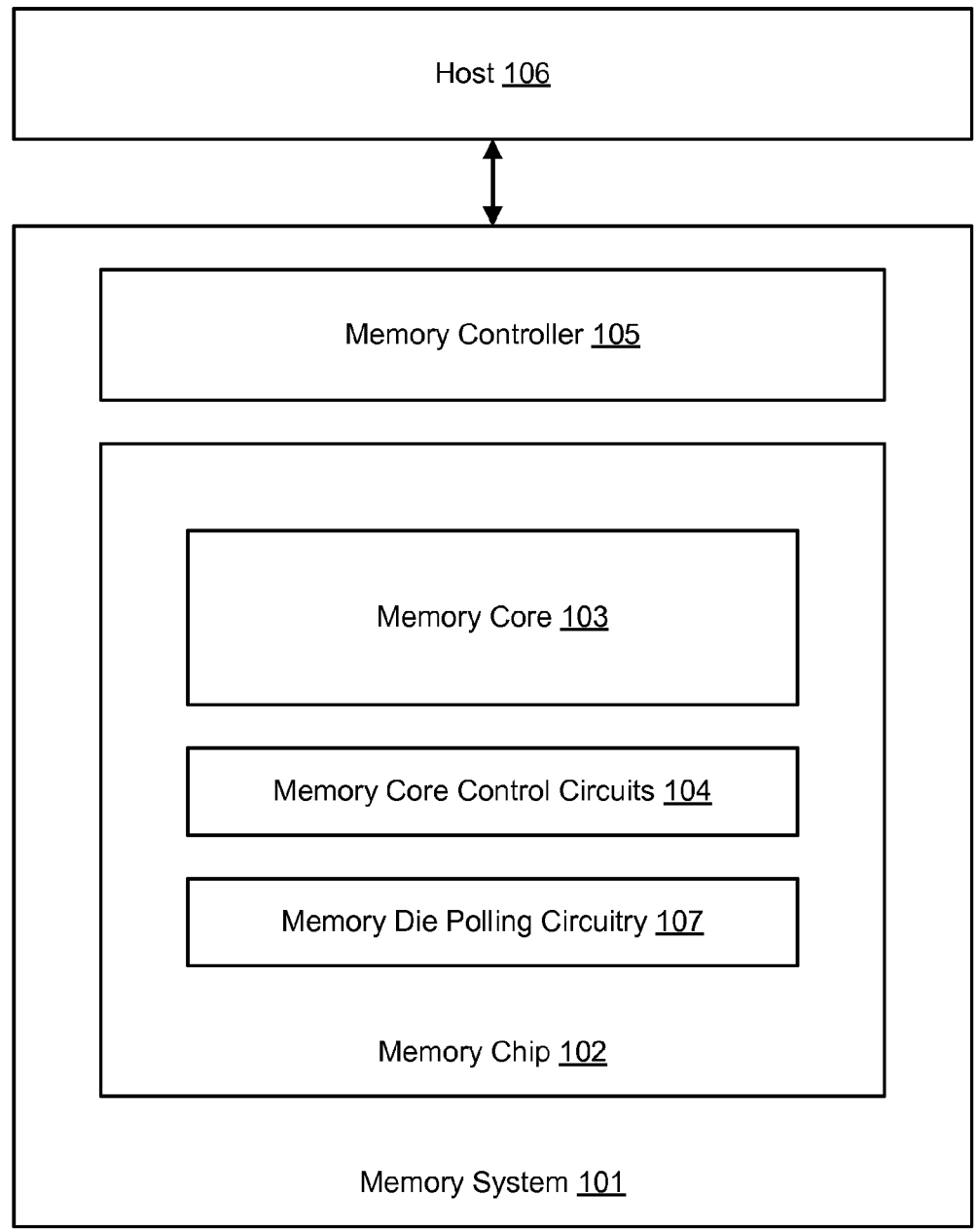
FIG. 2A depicts one embodiment of a memory system and a host.

FIG. 2A depicts one embodiment of a memory system 101 and a host 106. The host 106 may comprise a computing device (e.g., a personal computer, audio player, digital camera, or mobile computing device) or a storage device (e.g., an enterprise storage device). The memory system 101 may comprise a memory card, a flash drive, a system on a chip (SOC), or an embedded memory system. In one embodiment, the memory system 101 may be embedded within a multi-chip package. As depicted, the memory system 101 includes a memory controller 105 and a memory chip 102. In some cases, a memory system, such as memory system 101, may include more than one memory chip or memory die. In one example, the memory system 101 may include 16 NAND die stacked within a multi-chip package. The memory controller 105 may include one or more state machines, control logic, page registers, non-volatile memory, SRAM, or other circuitry for controlling the operation of memory chip 102. The one or more state machines, control logic, page registers, non-volatile memory, SRAM, and/or other circuitry for controlling the operation of the memory chip 102 may be referred to as managing or control circuits. The managing or control circuits may be used to facilitate one or more memory array operations associated with the memory chip 102 including erasing, programming, and reading operations. The memory controller 105 may receive data and commands from host 106 and provide memory chip data to host 106. In some embodiments, the memory controller 105 and memory chip 102 may be arranged on a single integrated circuit. In other embodiments, memory controller 105 and memory chip 102 may be arranged on different integrated circuits.

As depicted, the memory chip 102 includes memory core control circuits 104, memory die polling circuitry 107, and memory core 103. Memory core control circuits 104 may include logic for controlling the selection of memory blocks (or arrays) within memory core 103, controlling the generation of voltage references for biasing a particular memory array into a read or write state, and generating row and column addresses. The memory die polling circuitry 107 may include a state machine or control logic for polling other memory die within the memory system 101 and determining peak power supply currents for the other memory die. The memory core 103 may include one or more two-dimensional arrays of memory cells or one or more three-dimensional arrays of memory cells. The memory cells may comprise floating-gate transistors or non-volatile memory technologies that employ charge trapping, phase-change (e.g., chalcogenide materials), or state-change materials. In one embodiment, the memory core control circuits 104 and memory core 103 are arranged on a single integrated circuit. In other embodiments, the memory core control circuits 104 and memory core 103 may be arranged on different integrated circuits.

Referring to FIG. 2A, a memory system operation may be initiated when host 106 sends instructions to memory controller 105 indicating that it would like to read data from memory system 101 or write data to memory system 101. In the event of a write (or programming) operation, host 106 may send to memory controller 105 both a write command and the data to be written. The data to be written may be buffered by memory controller 105 and error correcting code (ECC) data may be generated corresponding with the data to be written. The ECC data, which allows data errors that occur during transmission or storage to be detected and/or corrected, may be written to memory core 103 or stored in non-volatile memory within memory controller 105. In one embodiment, the ECC data is generated and data errors are corrected by circuitry within memory controller 105.

In some cases, the operation of memory chip 102 may be controlled by memory controller 105. In one example, before issuing a write operation to memory chip 102, memory controller 105 may check a status register to make sure that memory chip 102 is able to accept the data to be written. In another example, before issuing a read operation to memory chip 102, memory controller 105 may pre-read overhead information associated with the data to be read. The overhead information may include ECC data associated with the data to be read or a redirection pointer to a new memory location within memory chip 102 in which to read the data requested. Once a read or write operation is initiated by memory controller 105, memory core control circuits 104 may generate the appropriate bias voltages for word lines and bit lines within memory core 103, as well as generate the appropriate memory block, row, and column addresses. The memory controller 105 may manage the translation (or mapping) of logical addresses received from the host 106 into physical addresses associated with the memory chip 102. The mapping tables for mapping the logical addresses corresponding with logical groups of data to physical address corresponding with memory locations within memory chip 102 may be stored within memory controller 105 or within memory chip 102.

In some embodiments, memory controller 105 may control one or more memory chips within a memory system. Each of the one or more memory chips may be organized into a plurality of memory blocks. In some cases, each of the one or more memory chips may be organized into a plurality of metablocks. A metablock may comprise a plurality of memory blocks. A memory block may comprise a group of memory cells that are erased concurrently (i.e., a unit of erase). In some cases, the group of memory cells may comprise a binary cache or a group of multi-level cells for storing user data. Each of the plurality of memory blocks may include a plurality of pages. A page may comprise a group of memory cells that may be accessed, programmed, and/or read concurrently. The group of memory cells within a page may share a common word line. In some cases, a memory block may comprise 32, 64, or 128 pages and each page may comprise 2 KB or 4 KB of data.

Figure 2B:
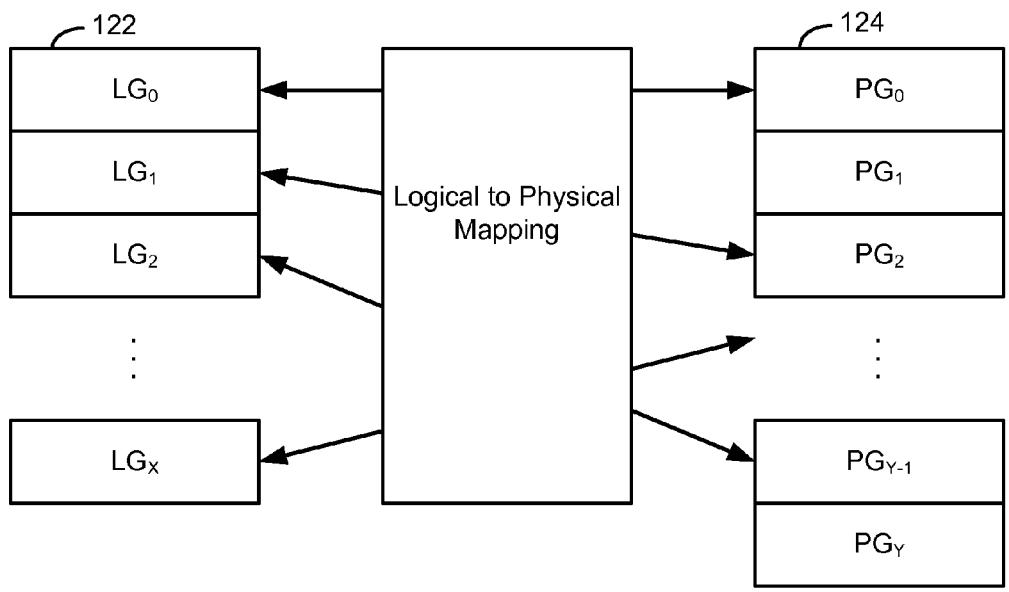
FIG. 2B depicts one embodiment of a mapping between logical groups and physical groups as performed by a memory system.

FIG. 2B depicts one embodiment of a mapping between logical groups and physical groups as performed by a memory system, such as memory system 101 in FIG. 2A. As depicted, each logical group of logical groups 122 (e.g., represented as a logical block address) is mapped to a unique physical group of physical groups 124 (e.g., represented as a memory block or page address). A logical group may be associated with a metablock, a page, or a portion of a page. In some cases, a logical group may comprise a grouping of one or more logical sectors which are mapped to a metablock. The logical to physical mapping between the logical groups and the physical groups may be stored in a table or list within a non-volatile memory, such as memory core 103 in FIG. 2A. In some cases, each logical group may be mapped to a metablock address. In one embodiment, a Group Address Table (GAT) may be used to store a mapping of metablock addresses for each logical group within a memory system.

Figure 2C:
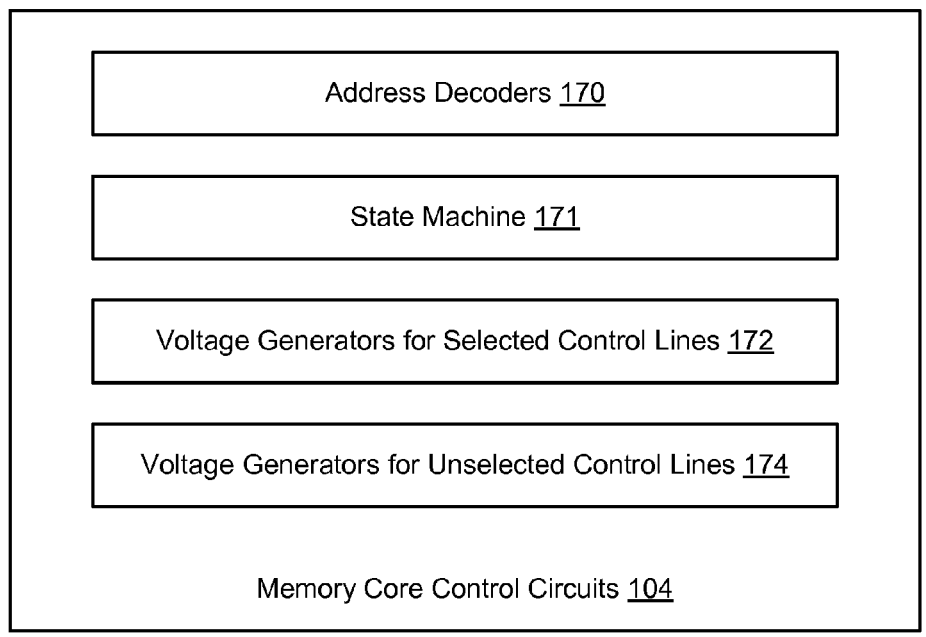
FIG. 2C depicts one embodiment of memory core control circuits.

FIG. 2C depicts one embodiment of memory core control circuits 104 in FIG. 2A. As depicted, the memory core control circuits 104 include address decoders 170, state machine 171, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block or memory array. The state machine 171 may provide chip-level control of memory operations. In one example, state machine 171 may cause various voltages to be applied to control lines (e.g., selected word lines and unselected word lines) within a memory array corresponding with a particular memory operation (e.g., a read or write operation). The state machine 171 may implement control logic for controlling read, write, or erase operations. In some cases, the state machine 171 may include random logic that has been synthesized using standard cells.

Figure 2D:
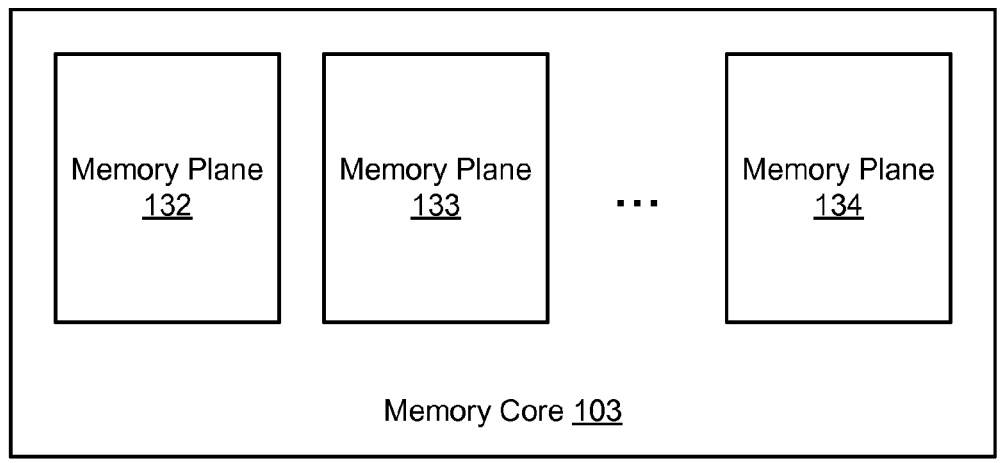
FIG. 2D depicts one embodiment of a memory core.

FIG. 2D depicts one embodiment of memory core 103 in FIG. 2A. As depicted, memory core 103 includes memory planes 132-134. In some embodiments, the number of memory planes (or bays) per memory core can be different for different implementations. For example, a memory core may include only a single memory plane or a plurality of memory planes (e.g., 16 memory planes). Each memory plane may comprise one or more memory blocks. Each memory block may comprise one or more memory cells. In some cases, multiple memory planes may be operated in parallel to increase read and/or write bandwidth. Although a memory core organization is depicted where memory planes comprise memory blocks, and memory blocks comprise a group of memory cells, other organizations or groupings can also be used with the technology described herein.

Figure 2E:
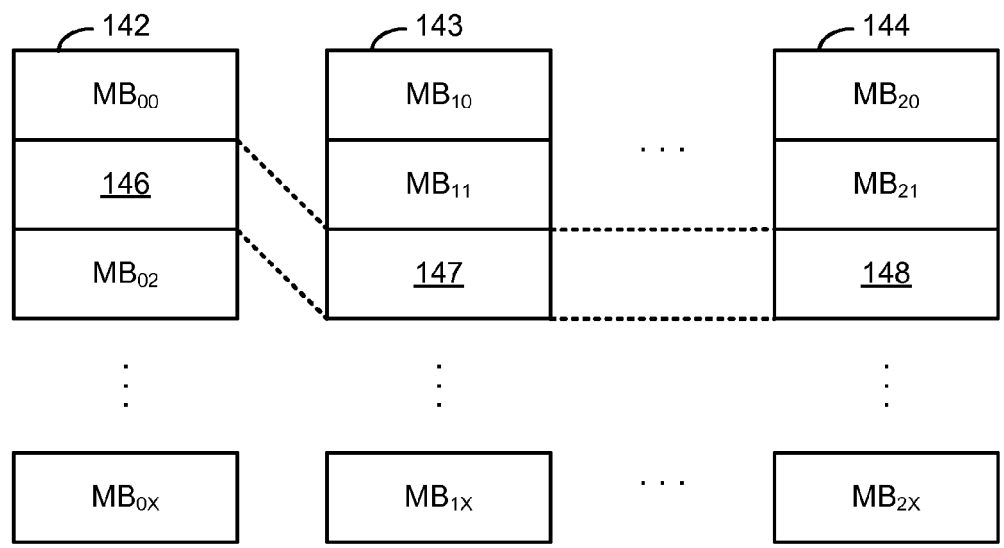
FIG. 2E depicts one embodiment of a memory core organization including a plurality of memory planes.

FIG. 2E depicts one embodiment of a memory core organization including a plurality of memory planes. The memory planes 142-144 each comprise a plurality of physical groups. Each physical group may comprise a memory block (e.g., memory block $MB_{00}$). In some cases, memory blocks across the plurality of physical groups may be linked together to form a metablock. For example, memory blocks 146-148 may be linked together to form a metablock. As depicted, the memory blocks used to form a metablock may be from various locations within their respective memory planes. For example, memory block 146 from memory plane 142, memory block 147 from memory plane 143, and memory block 148 from memory plane 144 may be linked together to form a metablock or a portion of a metablock. As each of the memory blocks may include a plurality of pages, a metapage extending across each of the memory planes 142-144 may be created by linking pages from each of the memory blocks within a metablock together. In some embodiments, a subset of the memory blocks within a memory plane may correspond with one or more spare blocks.

Figure 3:
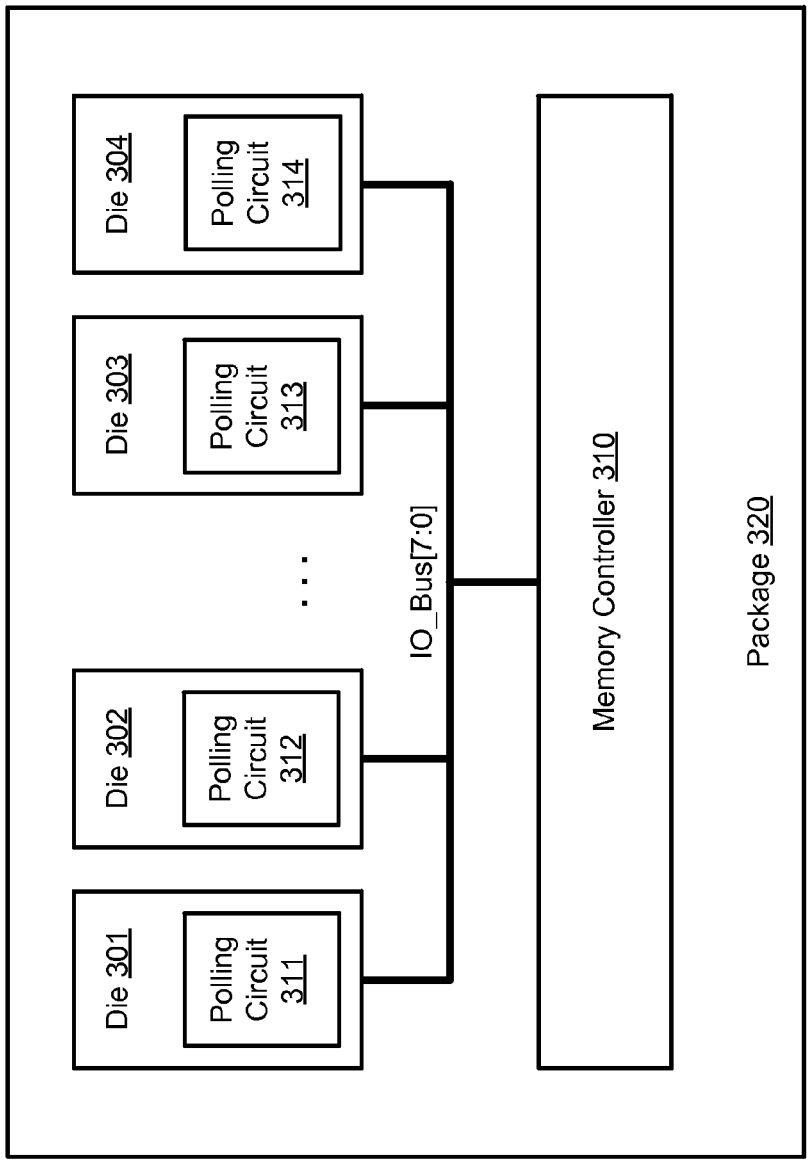
FIG. 3 depicts one embodiment of a portion of a memory system.

FIG. 3 depicts one embodiment of a portion of a system, such as memory system 101 in FIG. 2A, included within a package 320. The portion of the system comprises memory die 301-304 and memory controller 310 connected to the memory die 301-304 via a shared 8-bit I/O bus IO_Bus[7:0]. Each memory die includes a polling circuit, such as polling circuit 311 within memory die 301. The polling circuit 311 may poll other memory die connected to the shared I/O bus IO_Bus[7:0] prior to memory die 301 performing a particular memory operation (e.g., a programming operation), prior to charge pumps within memory die 301 charging up an internal node (e.g., prior to generating a programming voltage that is greater than a supply voltage to the memory die 301), or prior to memory die 301 setting a bit line precharge time associated with the particular memory operation (e.g., setting a rate at which bit lines within the memory die are precharged during a read or write operation). Although only four memory die are depicted in FIG. 3, the memory controller 310 may be connected to or in communication with more than or less than four memory die via a shared I/O bus. In some cases, the memory die 301-304 may be vertically stacked within the package 320 or arranged in a horizontal manner within the package 320. In some cases, the package 320 may comprise a BGA package or TSOP package. As depicted, the memory controller 310 may comprise a memory controller, such as memory controller 105 in FIG. 2A, and may transmit various commands (e.g., read command and write commands) and receive data from the memory die 301-304 via the shared I/O bus. The memory die 301-304 may comprise NAND Flash memory die.

In some embodiments, an ad-hoc polling system may be used to stagger the performance of high current or high ICC operations on a per die basis. As a system controller may not have visibility into when memory die are performing particular sub-tasks or sub-operations of a memory operation that has been assigned to them, each memory die may poll other memory die prior to performing a high ICC sub-task or a sub-operation that is associated with a high ICC value (e.g., charging up bit lines or charging up internal nodes with a large capacitance). A memory operation may comprise a plurality of sub-operations. In this case, prior to a memory die performing a high ICC sub-operation, the memory die (or the polling die) may poll other memory die in the system to find out if they are engaged in or about to engage in high ICC sub-operations. Based on the results of the polling, the memory die may decide to proceed with the high ICC sub-operation or to delay performing the high ICC sub-operation. In one example, a programming operation may have various high ICC peaks and those ICC peaks may correspond with the sub-operation the memory die is performing as part of the overall programming operation. Each sub-operation may be assigned an ICC value to indicate how much ICC is consumed during the sub-operation. Each sub-operation or sub-task may correspond with a particular time period during a memory operation. The ICC values may be stored within a look-up table or a non-volatile memory within each memory die. The ICC values may then be summed up to determine how much ICC is being consumed by the memory die within the system. If the total amount of ICC exceeds a certain threshold, then a polling die may delay or throttle down its own sub-tasks.

In one embodiment, the polling die may determine that the total ICC being used by other die right before the polling die is to perform a high ICC sub-operation is greater than a first threshold and a second threshold that is greater than the first threshold. If the total ICC being consumed by other die is not greater than the first threshold, then the polling die may perform the high ICC sub-operation. If the total ICC being used by the other die is greater than the first threshold but not greater than the second threshold, then the polling die may throttle down the high ICC sub-operation to reduce ICC (e.g., by reducing the frequency of charge pump clocks to limit the rate at which an internal node is charged up). If the total ICC being used by the other die is greater than the first threshold and greater than the second threshold, then the polling die may postpone or delay performing the high ICC sub-operation. In one example, the high ICC sub-operation may correspond with generating a programming voltage or generating a voltage that is a multiple of a supply voltage provided to a memory die.

Figure 4:
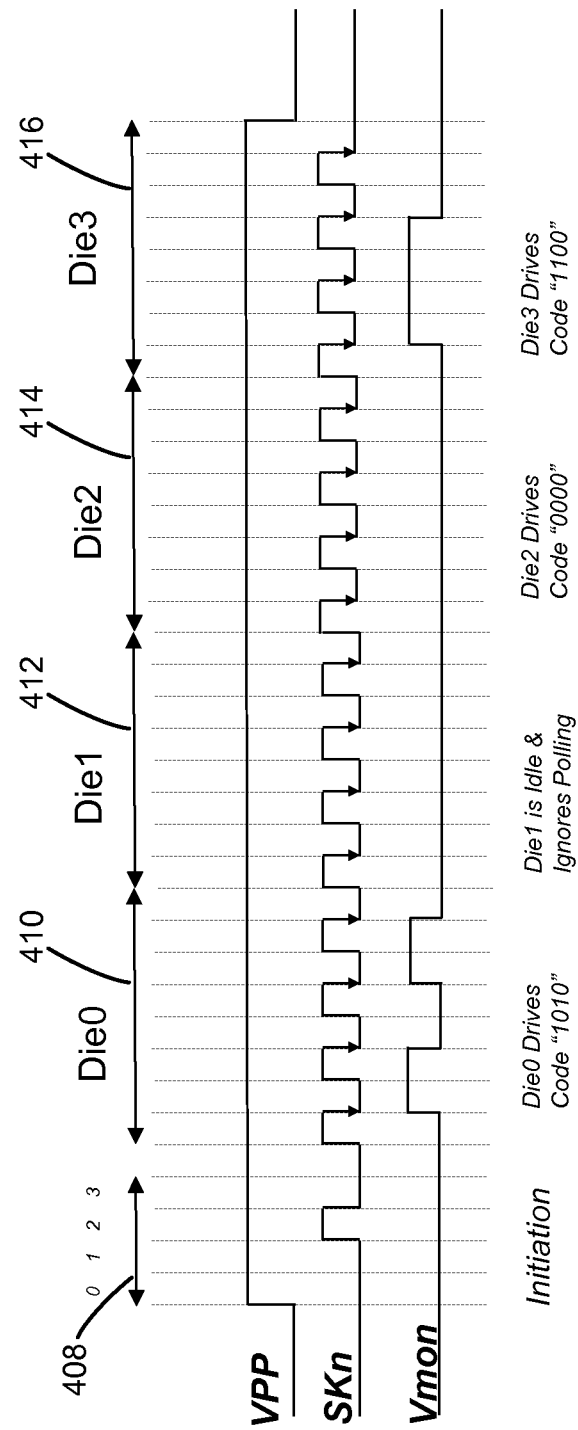
FIG. 4 depicts one embodiment of voltage waveforms for communicating power supply current information between memory die.

FIG. 4 depicts one embodiment of voltage waveforms for communicating power supply current values (e.g., ICC values) between memory die. As depicted, three pins (e.g., corresponding with VPP, SKn, and Vmon) may be used for polling and receiving power supply current information from multiple memory die. The plurality of memory die may comprise four memory die Die0, Die1, Die2, and Die3. During an initiation phase 408, Die2 raises VPP to initiate polling and then raises SKn (e.g., from 0V to VDD) during a time period corresponding with Die2. The initiation phase 408 may comprise four time slots 0-3 associated with the four memory die. In this case, Die2 may raise SKn because neither Die0 nor Die1 raised SKn during the prior two time slots subsequent to VPP being raised at the start of the initiation phase 408. After the initiation phase 408, Die2 may toggle SKn or drive SKn with a clock signal. Data may be captured or latched on the falling edges of SKn. Die0 may control the Vmon line during the time period 410 and transmit a code "1010" associated with a particular power supply current value for Die0 (e.g., corresponding with an average or peak current value for Die0's power supply). Die1 may control the Vmon line during the time period 412 and not transmit a code or hold the Vmon line at ground as Die1 may be idling and not performing a memory operation. The code "0000" may correspond with a power supply current value of 0 mA or a power supply current value that is less than 100 µA. Die2 may keep the Vmon line at ground during the time period 414 as Die2 is the polling die. Die3 may control the Vmon line during the time period 416 and transmit a code "1100" associated with a particular power supply current value for Die3. After the time period 416 has passed, Die2 may release VPP or cause VPP to transition from VDD to 0V.

Figure 5:
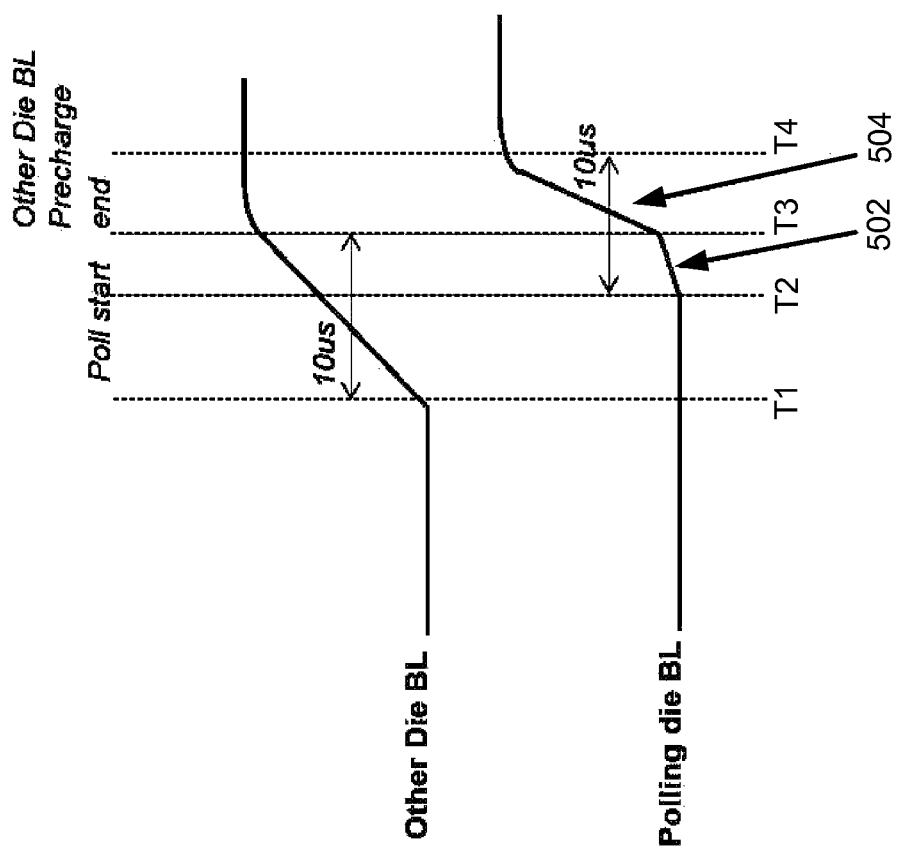
FIG. 5 depicts one embodiment of voltage waveforms of internal nodes within two memory die.

FIG. 5 depicts one embodiment of voltage waveforms of internal nodes within memory die. As depicted, a first bit line within a first memory die (Other Die BL) may charge up from a first voltage (e.g., 0V) at time T1 to a second voltage greater than the first voltage (e.g., 4V or 15V) at time T3. The time to charge up the first bit line may comprise 10 µs. Prior to time T2, a second memory die may identify that a particular memory operation (e.g., a write operation) or sub-operation is to be performed and poll the first memory die for power supply current information. The second memory die may determine that a total power supply current associated with an operation or a sub-operation being performed by the first memory die is above a current threshold and set a ramp rate for an internal node to a first ramp rate based on the total power supply current. As depicted, at time T2, a second bit line within the second memory die is charged up from a first voltage (e.g., 0V) to a third voltage greater than the first voltage (e.g., 2V) at the first ramp rate.

The second memory die may re-poll the first memory die for subsequent power supply current information and determine that the total power supply current for the first memory die is below the current threshold. In this case, at time T3, the first bit line has completed being charged up to the second voltage causing the power supply current for the first memory die to be reduced. In response, the second memory die may set the ramp rate to a second ramp rate greater than the first ramp rate and the second bit line may be charged up from the third voltage less than the second voltage to the second voltage. Thus, the second bit line may be charged up from the first voltage to the third voltage using a first ramp rate 502 and may be charged up from the third voltage to the second voltage using a second ramp rate 504 different from the first ramp rate 502. In the case depicted, the second ramp rate 504 is greater than or steeper than the first ramp rate 502. Due to the adjustment in ramp rate, the time to charge up the second bit line may comprise 10 µs. One benefit of using dynamic polling or re-polling memory die for power supply current information after the second bit line has started charging up is that the ramp rate may be increased to improve performance.

In some embodiments, rather than setting and adjusting a ramp rate for an internal node of a memory die, a precharge time for the internal node may be set and adjusted over time based on the power supply current used by other memory die. The internal node may comprise a word line or a bit line. In one example, the bit line precharge time for precharging bit lines of a memory die may be set and then adjusted over time based on the power supply current used by other memory die.

Figure 6A:
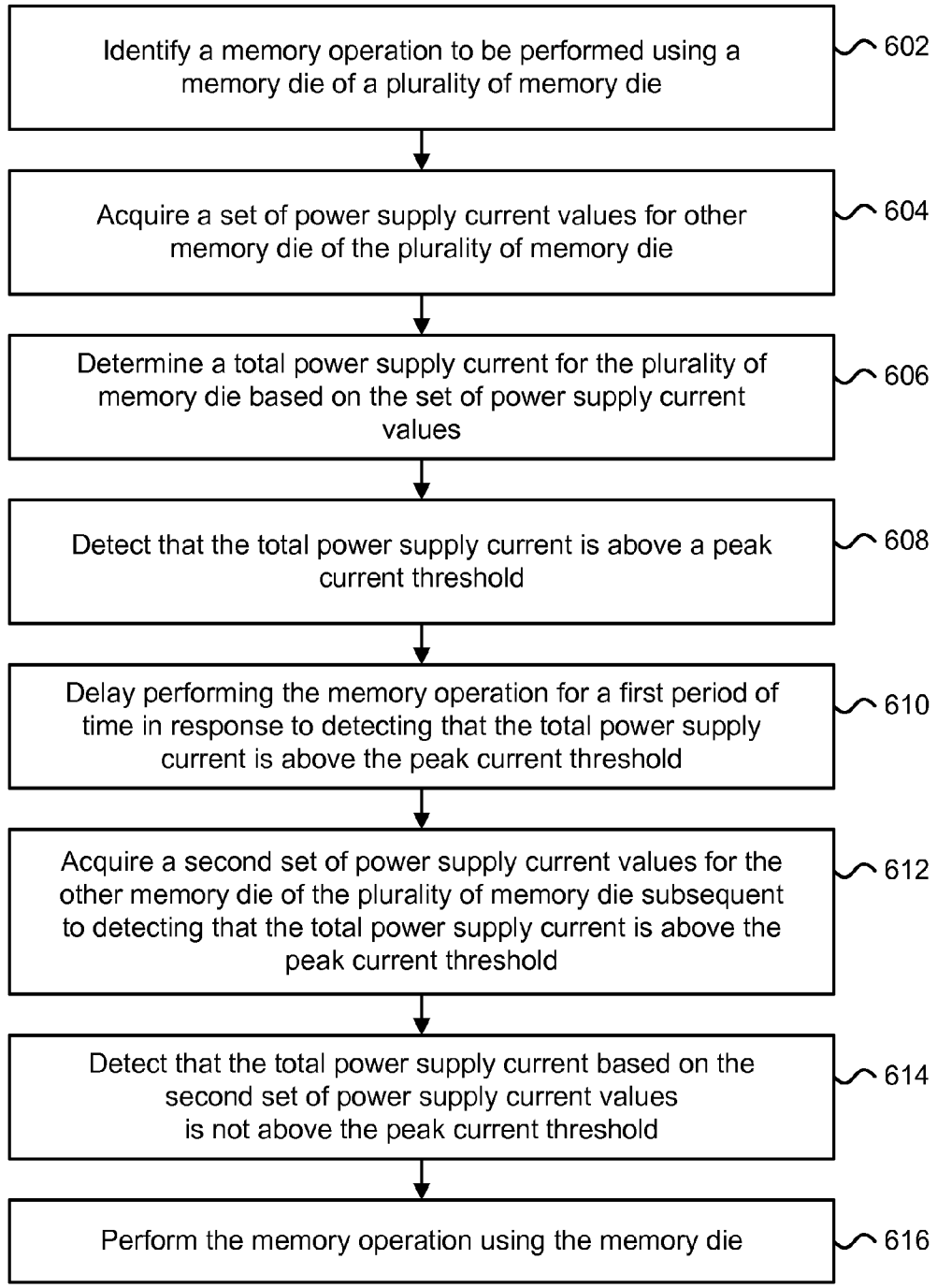
FIG. 6A is a flowchart describing one embodiment of a process for performing a memory operation.

FIG. 6A is a flowchart describing one embodiment of a process for performing a memory operation. In one embodiment, the process of FIG. 6A may be performed by a non-volatile storage system, such as memory system 101 in FIG. 2A, or by a memory die, such as memory chip 102 in FIG. 2A.

In step 602, a memory operation to be performed using a memory die of a plurality of memory die is identified. The memory operation may comprise a write operation, a programming operation, an erase operation, a program verify operation, or a read operation. The plurality of memory die may comprise a plurality of NAND memory die. The memory operation may be identified via a memory operation command issued by a controller of a non-volatile storage system (e.g., a programming command or a read command). In some cases, the memory operation corresponds with one or more memory sub-operations. In step 604, a set of power supply current values for other memory die of the plurality of memory die is acquired. In one embodiment, the plurality of memory die may comprise eight memory die and the other memory die may comprise seven memory die. The set of power supply current values may be acquired by the memory die by polling the other memory die. In one example, three pins shared by the plurality of memory die (e.g., VPP, SKn, and Vmon) may be used to obtain the set of power supply current values from the other memory die.

In step 606, a total power supply current for the plurality of memory die is determined based on the set of power supply current values. The total power supply current may comprise the sum of current values from the set of power supply current values. In one example, if the plurality of memory die comprises eight memory die and the other memory die comprises seven memory die, then the set of power supply current values may comprise seven power supply current values and the total power supply current may comprise the sum of the seven power supply current values and a power supply current value for the memory die. In some cases, the total power supply current may comprise the total peak power supply current for the plurality of memory die during a period of time during which the other memory die have been polled. The set of power supply current values may correspond with a set of current ranges for sub-operations performed by the other memory die. In one example, a first power supply current value of the set of power supply current values may correspond with a current range between 200 μA and 400 μA.

In step 608, it is detected that the total power supply current is above a peak current threshold (e.g., is more than 50 mA). In step 610, performance of the memory operation is delayed for a first period of time (e.g., for 5 μs) in response to detecting that the total power supply current is about the peak current threshold. In step 612, a second set of power supply current values for the other memory die of the plurality of memory die is acquired subsequent to detecting that the total power supply current is above the peak current threshold. In step 614, it is detected that the total power supply current based on the second set of power supply current values is not above the peak current threshold. In step 616, the memory operation is performed using the memory die. In one embodiment, the memory operation may be performed upon detecting that the total power supply current is below the peak current threshold.

Figure 6B:
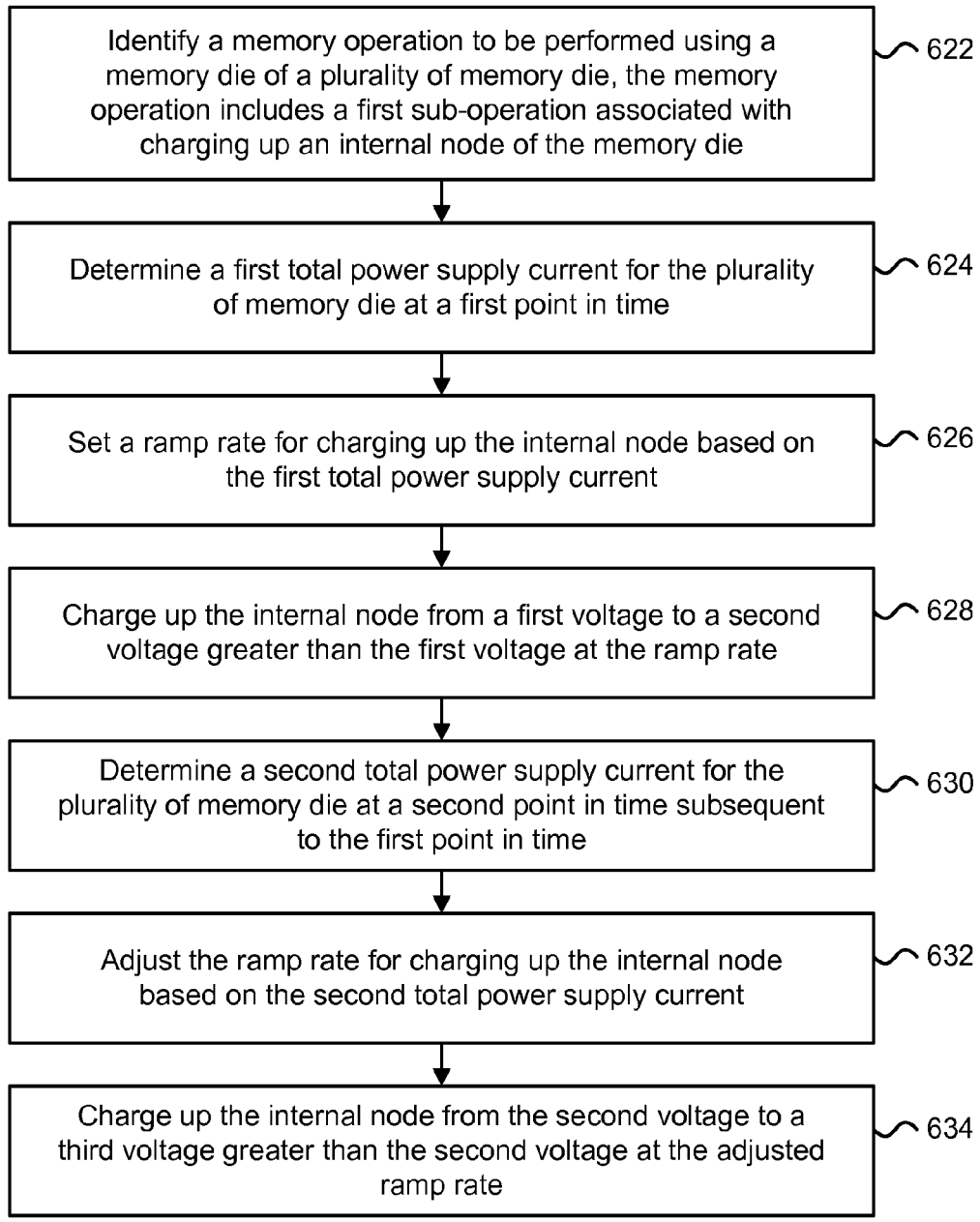
FIG. 6B is a flowchart describing another embodiment of a process for performing a memory operation.

FIG. 6B is a flowchart describing another embodiment of a process for performing a memory operation. In one embodiment, the process of FIG. 6B may be performed by a non-volatile storage system, such as memory system 101 in FIG. 2A, or by a memory die, such as memory chip 102 in FIG. 2A.

In step 622, a memory operation to be performed using a memory die of a plurality of memory die is identified. The memory operation may include a first sub-operation associated with charging up an internal node of the memory die. In one embodiment, the internal node may comprise a bit line. In another embodiment, the internal node may correspond with the output of a charge pump or the output of a voltage multiplier (e.g., for generating an on-chip programming voltage or erase voltage). In another embodiment, the internal node may correspond with an output of a voltage regulator. In step 624, a first total power supply current for the plurality of memory die is determined at a first point in time. In one example, the first total power supply current for the plurality of memory die may be acquired in response to identifying the memory operation to be performed. The first total power supply current may be acquired by polling other memory die of the plurality of memory die and summing power supply current values or codes received from other memory die of the plurality of memory die.

In step 626, a ramp rate for charging up the internal node is set based on the first total power supply current. The ramp rate may be determined using a lookup table of ramp rates over different power supply current ranges. In some embodiments, a precharge time setting for the internal node may be set based on the first total power supply current. In step 628, the internal node is charged up from a first voltage to a second voltage greater than the first voltage at the ramp rate or using the precharge time setting. In step 630, a second total power supply current for the plurality of memory die is determined at a second point in time subsequent to the first point in time. In step 632, the ramp rate for charging up the internal node is adjusted based on the second total power supply current. In one embodiment, the ramp rate may be increased in order to charge up the internal mode more quickly. In another embodiment, the ramp rate may be decreased in order to reduce power supply current consumed by the memory die. In step 634, the internal node is charged up from the second voltage to a third voltage greater than the second voltage at the adjusted ramp rate.

In one embodiment, the internal node may correspond with an output node of a charge pump for generating a programming voltage. The internal node may be charged up at a first ramp rate from 0V to 3V due to a total power supply current being above a particular current threshold (e.g., 50 mA) and then charged up at a second ramp rate that is greater than the first ramp rate from 3V to 10V due to the total power supply current being below the particular current threshold.

In some embodiments, a precharge time setting for the internal node may be adjusted based on the second total power supply current. In one embodiment, the precharge time setting may be reduced in order to charge up the internal mode more quickly. In one example, the precharge time setting for charging up bit lines within the memory die have be adjusted to decrease the time to charge up the bit lines.

One embodiment of the disclosed technology includes a first memory die and a second memory die. The second memory die configured to acquire a power supply current value for the first memory die and set a ramp rate for charging up an internal node of the second memory die based on the power supply current value. The second memory die configured to charge up the internal node from a first voltage to a second voltage greater than the first voltage at the ramp rate.

In some cases, the second memory die may be configured to acquire a second power supply current value for the first memory die subsequent to charging up the internal node from the first voltage, configured to adjust the ramp rate for charging up the internal node based on the second power supply current value, and configured to charge up the internal node from the second voltage to a third voltage greater than the second voltage at the adjusted ramp rate.

One embodiment of the disclosed technology includes identifying a memory operation to be performed using a memory die of a plurality of memory die. The memory operation includes charging up an internal node of the memory die. The method further comprises determining a first total power supply current for the plurality of memory die prior to performing the memory operation, setting a ramp rate for charging up the internal node based on the first total power supply current, and charging up the internal node from a first voltage to a second voltage greater than the first voltage at the ramp rate.

One embodiment of the disclosed technology includes a first memory die and a second memory die. The second memory die configured to determine a power supply current consumed by the first memory die and determine a difference between the power supply current consumed by the first memory die and a maximum current threshold. The second memory die configured to set a precharge time for charging up an internal node of the second memory die based on the difference. The second memory die configured to charge up the internal node from a first voltage to a second voltage greater than the first voltage at the ramp rate.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a first memory die; and
a second memory die configured to acquire a power supply current value for the first memory die and set a rate for charging up an internal node of the second memory die based on the power supply current value, the second memory die configured to charge up the internal node from a first voltage to a second voltage greater than the first voltage at the rate, the second memory die configured to adjust the rate for charging up the internal node based on a second power supply current value for the first memory die and charge up the internal node from the second voltage to a voltage greater than the second voltage at the adjusted rate.

2. The apparatus of claim 1, wherein:
the second memory die configured to acquire the second power supply current value for the first memory die subsequent to charging up the internal node at the rate.

3. The apparatus of claim 1, wherein:
the second memory die configured to increase the rate for charging up the internal node based on the second power supply current value.

4. The apparatus of claim 1, wherein:
the second memory die configured to identify a memory operation scheduled for the second memory die and acquire the power supply current value for the first memory die from the first memory die in response to identifying the scheduled memory operation.

5. The apparatus of claim 1, wherein:
the power supply current value for the first memory die is equal to a peak power supply current value for the first memory die.

6. The apparatus of claim 1, wherein:
the internal node comprises a bit line.

7. The apparatus of claim 1, wherein:
the first memory die comprises a first non-volatile memory die; and
the second memory die comprises a second non-volatile memory die.

8. The apparatus of claim 1, wherein:
the second memory die includes non-volatile memory that is monolithically formed in one or more physical levels of memory cells having active areas disposed above a silicon substrate.

9. A method, comprising:
identifying a memory operation to be performed using a memory die of a plurality of memory die, the memory operation includes charging up an internal node of the memory die;
determining a first total power supply current for the plurality of memory die prior to performing the memory operation;
setting a ramp rate for charging up the internal node based on the first total power supply current;
charging up the internal node from a first voltage to a second voltage greater than the first voltage at the ramp rate;
adjusting the ramp rate for charging up the internal node based on a second total power supply current for the plurality of memory die; and
charging up the internal node from the second voltage to a voltage greater than the second voltage at the adjusted ramp rate.

10. The method of claim 9, further comprising:
determining the second total power supply current for the plurality of memory die subsequent to setting the ramp rate.

11. The method of claim 9, wherein:
the adjusting the ramp rate comprises increasing the ramp rate.

12. The method of claim 9, wherein:
the first total power supply current for the plurality of memory die comprises a sum of power supply current values for each memory die of the plurality of memory die.

13. The method of claim 9, wherein:
the memory operation comprises a programming operation; and
the internal node comprises an output of a charge pump configured to generate a programming voltage during the programming operation.

14. The method of claim 9, wherein:
the determining a first total power supply current for the plurality of memory die includes receiving from a set of memory die of the plurality of memory die power supply current information associated with the amount of power supply current being consumed by the set of memory die.

15. The method of claim 9, wherein:
the internal node comprises a bit line.

16. The method of claim 9, wherein:
the plurality of memory die comprises eight NAND Flash memory die.

17. The method of claim 9, wherein:
the memory die includes non-volatile memory that is monolithically formed in one or more physical levels of memory cells having active areas disposed above a silicon substrate.

18. A system, comprising:
a first memory die; and
a second memory die including a polling circuit configured to determine a power supply current consumed by the first memory die and determine a difference between the power supply current consumed by the first memory die and a maximum current threshold, the polling circuit configured to set a precharge time for charging up an internal node of the second memory die based on the difference, the second memory die configured to charge up the internal node from a first voltage to a second voltage greater than the first voltage based on the precharge time, the second memory die configured to adjust the precharge time for charging up the internal node based on a second difference between a second power supply current consumed by the first memory die and the maximum current threshold, the second memory die configured to charge up the internal node from the second voltage to a voltage greater than the second voltage based on the adjusted precharge time.

19. The system of claim 18, wherein:
the polling circuit configured to determine the second power supply current consumed by the first memory die and determine the second difference between the second power supply current consumed by the first memory die and the maximum current threshold.

20. The system of claim 18, wherein:
the internal node comprises a bit line; and
the second memory die configured to increase the precharge time for charging up the bit line based on the second difference.

* * * * *